(12) United States Patent
Lapiana

(10) Patent No.: US 10,205,454 B2  
(45) Date of Patent: Feb. 12, 2019

(54) GLITCH FREE ASYNCHRONOUS CLOCK MULTIPLEXER

(71) Applicant: GOVERMENT OF THE UNITED STATES AS REPRESENTED BY TE SECRETARY OF THE AIR FORCE, Rome, NY (US)

(72) Inventor: Giuseppe A. Lapiana, Liverpool, NY (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 15/358,642

(22) Filed: Nov. 22, 2016

(65) Prior Publication Data

US 2018/0145689 A1    May 24, 2018

(51) Int. Cl.
| | |
|---|---|
| *H03L 7/00* | (2006.01) |
| *H03K 19/003* | (2006.01) |
| *H03K 5/135* | (2006.01) |
| *H03K 5/00* | (2006.01) |

(52) U.S. Cl.
CPC ....... *H03K 19/00346* (2013.01); *H03K 5/135* (2013.01); *H03K 2005/00234* (2013.01)

(58) Field of Classification Search  
CPC .... G06F 1/04; G06F 1/08; G06F 1/10; H03K 5/1252; H03K 5/132; H03K 5/135; H03K 19/00346; H03K 2005/00234; H03K 7/00; H03K 7/0814  
See application file for complete search history.

(56) References Cited

U.S. PATENT DOCUMENTS

| | | | |
|---|---|---|---|
| 7,471,120 B2* | 12/2008 | Lou ............................ | G06F 1/04 327/407 |
| 9,720,438 B2* | 8/2017 | Lee ............................ | G06F 1/10 |
| 2008/0284484 A1* | 11/2008 | Lou ............................ | G06F 1/04 327/298 |
| 2016/0041578 A1* | 2/2016 | Lee ............................ | G06F 1/10 713/400 |

* cited by examiner

*Primary Examiner* — Long Nguyen  
(74) *Attorney, Agent, or Firm* — Joseph A. Mancini

(57) ABSTRACT

Apparatus for glitch-free switching between multiple asynchronous clock sources on an integrated circuit. Clock gaters provide a clock from a single source that can be turned on and off without causing partial pulses to be created. Control circuitry going to the individual clock gaters is synchronized to the destination clock domain and provides the ability to shut all clocks off for a period of time equal to the longest clock period. By combining the clocks with an OR gate and gating all clocks off before switching from one clock to another, a glitch-free train of clock pulses can be created from individual clock inputs. Since clock glitches can cause erratic behavior in integrated circuits, this invention allows one to switch between different, asynchronous clocks without causing erratic behavior.

4 Claims, 4 Drawing Sheets

Glitch Free Asynchronous Clock Multiplexor

GLITCH FREE ASYNCHRONOUS CLOCK MULTIPLEXER

STATEMENT OF GOVERNMENT INTEREST

The invention described herein may be manufactured and used by or for the Government for governmental purposes without the payment of any royalty thereon.

BACKGROUND OF THE INVENTION

The Joint Test Action Group (JTAG) developed a 5 pin test access port standard which is commonly referred to as JTAG. JTAG is used for a variety of Integrated Circuit (IC) and board level tests. During IC test and debug it can be helpful to allow the JTAG (TCK) clock to be driven onto the main clock tree. This allows input test vectors to be loaded while the clock is stable and then allows the IC to function under normal operating conditions.

Referring to FIG. 3, in U.S. Pat. No. 9,024,661 to Rooks the prior art developed a method to switch between a system clock and the JTAG clock without glitches. This technique prevents erratic behavior during IC testing, but as designed, is limited to systems where the JTAG and other clocks are synchronous. In many IC's, the JTAG TCK and other clocks of interest are not synchronous and are provided from an independent source. For these systems, the prior art cannot prevent unwanted clock glitches during test, and can result in incorrect failure behavior.

Referring to FIG. 2, a prior art synchronizing circuit uses one or more D flip-flops in series, with the clock inputs being driven from the destination clock domain. When the input is driven, the synchronizer allows time for the output to settle into a known state. The number of flip-flops required is a function of the clock period and settling time for a particular technology.

Referring to FIG. 1, a prior art clock gater combines an AND gate and an active low latch (passes data when clock is low) to ensure that inputs arriving at unknown times do not impact the output clock waveform. This prevents short pulses from entering the system. The input enable to the clock gater must be synchronous with the clock to guarantee that the output does not enter an unknown state.

The prior art has driven control from JTAG (TCK) directly into the enable (gate) input of a clock gater (see FIG. 3) whose clock input is not of the same clock domain. The concern with this design is that asynchronous clocks cannot be timed relative to each other since their phase at some given time will be unknown. This can result in a failure of the clock multiplexing circuitry.

OBJECTS AND SUMMARY OF THE INVENTION

It is therefore an object of the present invention to provide an apparatus that overcomes the prior art's limitations in selecting one of several, unrelated clocks to be used in clocking an integrated circuit. The present invention switches between two clocks ensuring no short pulses are created, either a short time at "1" or a short time at "0", thereby eliminating the prior art's limitation and restriction that all clocks must be synchronous with each other.

Briefly stated, the present invention provides an apparatus for glitch-free switching between multiple asynchronous clock sources on an integrated circuit. Clock gaters provide a clock from a single source that can be turned on and off without causing partial pulses to be created. Control circuitry going to the individual clock gaters is synchronized to the destination clock domain and provides the ability to shut all clocks off for a period of time equal to the longest clock period. By combining the clocks with an OR gate and gating all clocks off before switching from one clock to another, a glitch-free train of clock pulses can be created from individual clock inputs. Since clock glitches can cause erratic behavior in integrated circuits, this invention allows one to switch between different, asynchronous clocks without causing erratic behavior.

In a preferred embodiment of the present invention, a glitch free, multi-clock, asynchronous control circuit comprises a plurality of N clock gater circuits, where N is any predetermined positive, whole, real, integer number greater than two, each having a clock input, a gate input, and a gated clock output; a plurality of N−1 synchronizer circuits, each having a control input, a clock input, and an output, each output being connected to a gate input of N−1 corresponding clock gater circuits wherein each clock gater circuit and corresponding synchronizer circuit share a common clock; an OR gate having inputs and an output, each input being connected to a corresponding gated clock output of the N clock gater circuits; and a plurality of N latches wherein each latch in the plurality is connected to a corresponding clock gater circuit; and wherein each latch has a clock input, a set input, and an output, wherein the output of each of N−1 latches is connected to the gate input of each of a corresponding N−1 synchronizer circuit; the output of an $N^{th}$ latch is connected to the gate input of an $N^{th}$ clock gater circuit; each of the N latches shares a common clock; and the $N^{th}$ latch shares a clock with the $N^{th}$ clock gater circuit.

DETAILED DESCRIPTION OF THE PREFERRED EMBODIMENT

The present invention utilizes known prior art components in a novel and non-obvious fashion to specifically overcome the prior art's limitation that all clock signals must be synchronous.

Figure 1:
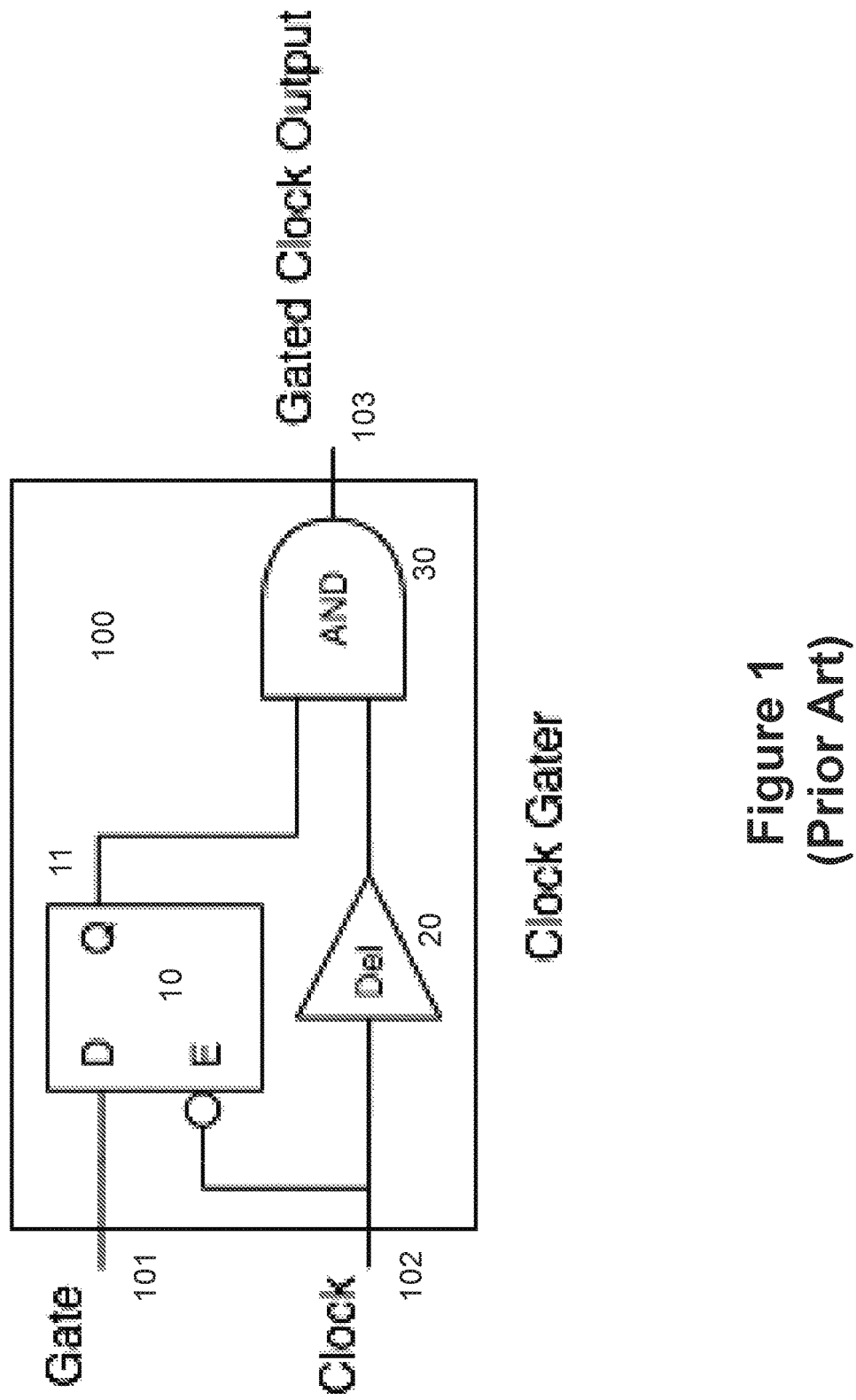
FIG. 1 is a schematic diagram representation of a prior art clock gater.

Referring to FIG. 1, the key components of a generic prior art clock gater 100 include a gate input 101, which determines if the clock will be passed through or if the output 103 will drive a zero instead. Positive pulses from the clock input 102 are optionally passed to the clock gater output 103 based on the latched value captured by latch 10. Delay cell 20 ensures that the latch 10 has a stable output 11 feeding into AND gate 30 prior to the clock rising edge arriving from delay 20. The clock gater circuitry 100 along with appropriate timing constraints ensures that only whole clock pulses pass through to its output 103.

Figure 2:
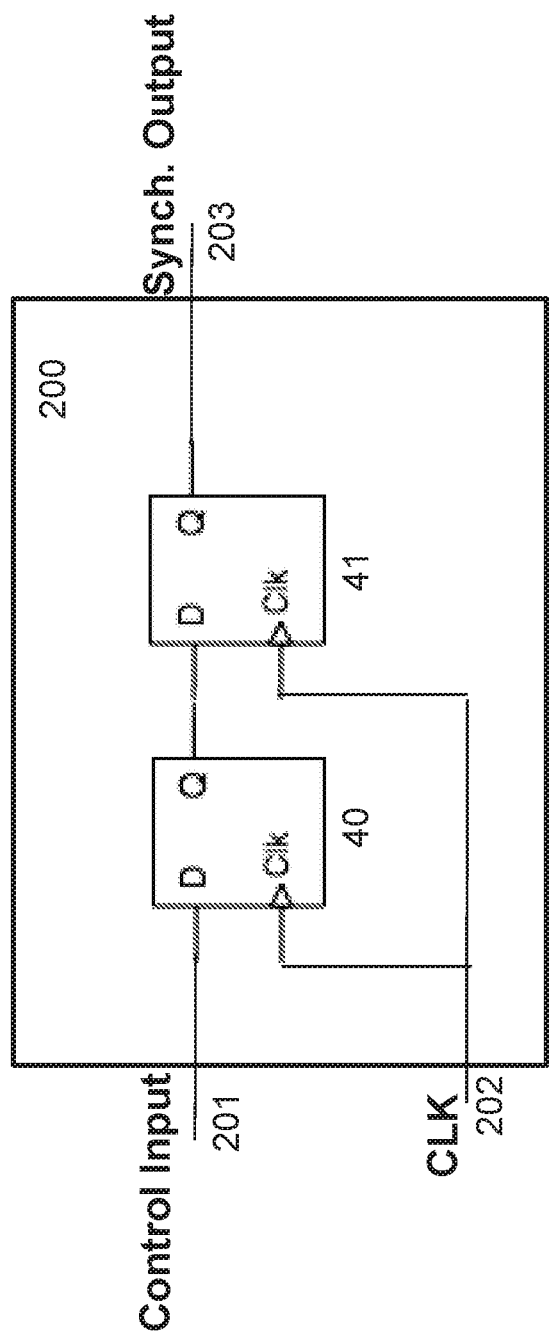
FIG. 2 is a schematic diagram representation of a prior art synchronizing circuit.

Referring to FIG. 2, the key components of a prior art synchronizing circuit 200 include an in input 201 which is asynchronous to the destination clock input 202. D flip-flop 40 samples 201 using clock 202 and may become unstable.

D flip-flop 41 waits one period of clock 202 for the output of 40 to settle into a known state. The output of 41 provides a synchronous output 203.

Figure 3:
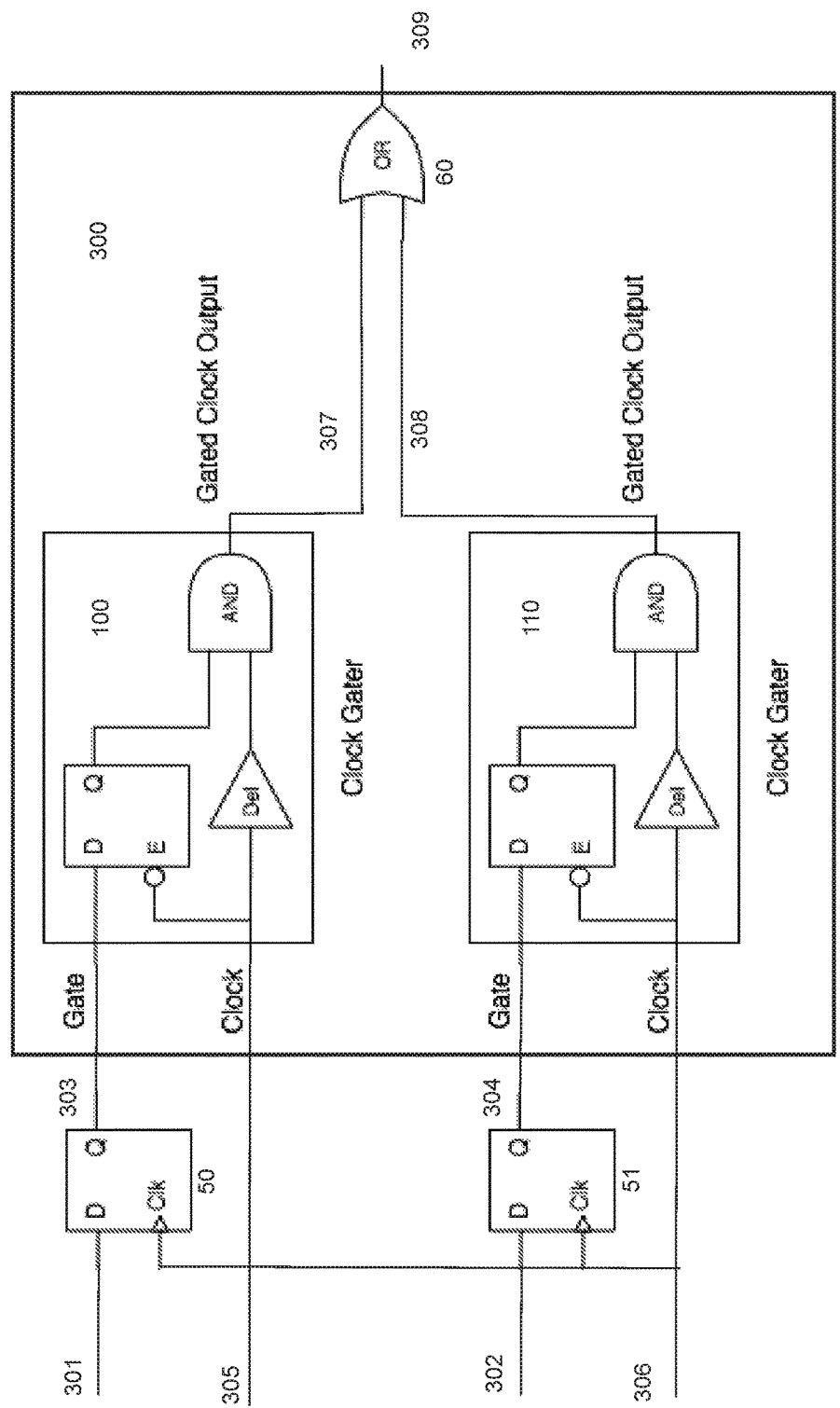
FIG. 3 is a schematic diagram representation of a prior art glitch free clock multiplexor.

Referring to FIG. 3, the key components of a prior art glitch free clock multiplexor 300 comprise two or more clock gaters 100, 110, control inputs 301, and 302 from the JTAG controller or other suitable controller, and an OR gate 60. Flip-flops 50 and 51 drive the individual clock gater inputs 303 and 304, respectively. Flip-flop 50 resets to 1, flip-flop 51 resets to 0, (input 303 is 1, input 304 is 0), on reset the main clock 305 is passed through to output 309. In order to change the clock driving output 309 from main clock 305 to JTAG clock 306, a JTAG instruction scan (and update) would be performed setting both flip-flop 50 output and flip-flop 51 output to zero, followed by a second JTAG instruction scan (and update) keeping flip-flop 50 output at zero and setting flip-flop 51 output to 1. The individual gaters 100, 110, ensure only whole positive pulses are provided to OR gate 60, resulting in whole pulses at the output 309. A JTAG scan time period is much longer than either the main clock period presented at 303 or the JTAG clock period presented at 304. By setting both bit 303 and 304 to zero for a JTAG scan any overlap in the output of the two gaters 100, 110 is avoided.

Figure 4:
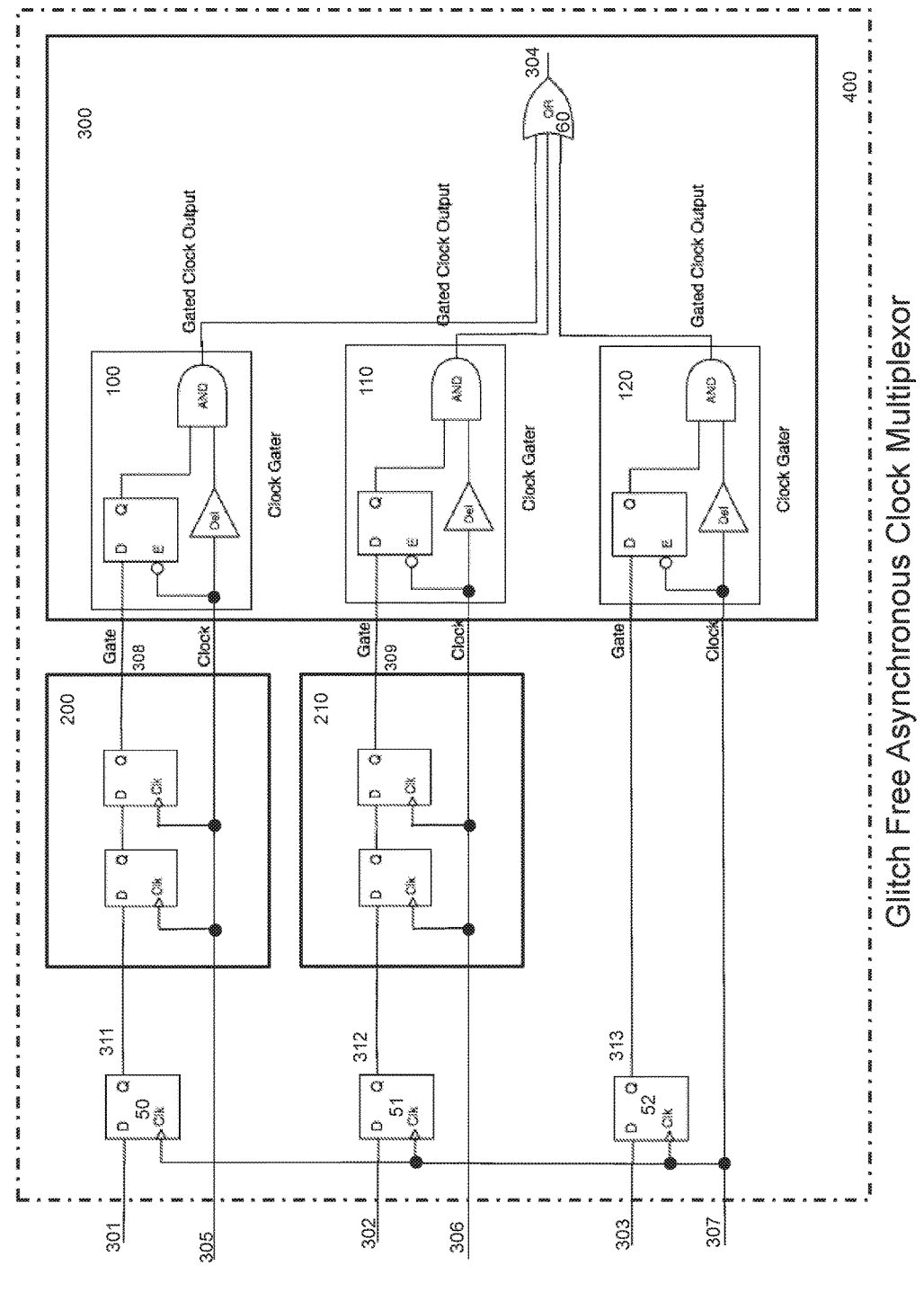
FIG. 4 is schematic diagram representation of the present invention.

Referring to FIG. 4, the key components of the present invention 400, are designed around a prior art synchronizing circuits 200, 210, inputs 301, 302, 303, synchronous to clock 307 and around a prior art glitch free clock multiplexor 300. Inputs 301 and 302 are asynchronous to prior art clock gaters 100 and 110. Synchronizing circuits 200 and 210 synchronize flip-flop 50 and 51 outputs 311 and 312 to clocks 305 and 306 respectively, ensuring that timing requirements between synchronizing circuit 200 output 308 and clock 305, and likewise between synchronizing circuit 210 output 309 and clock 306 can be guaranteed using standard digital design techniques. Because clock 307 is multiplexed onto the clock tree using clock gater 120, a synchronizing circuit is not necessary, since the gate input 303 is already synchronous to clock 307. This technique allows a multitude of asynchronous clocks to be driven onto the main clock tree without glitching.

What is claimed is:

1. A glitch free, multi-clock, asynchronous control circuit comprising
   N clock gater circuits, each having a clock input, a gate input, and a gated clock output;
   N−1 synchronizer circuits, each having a control input, a clock input, and an output, each said output being connected to a gate input of a corresponding said clock gater circuit;
   wherein each said clock gater circuit and said corresponding synchronizer circuit share a common clock selected from the group consisting of a main clock and a JTAG clock;
   an OR gate having inputs and an output, each said input being connected to a corresponding gated clock output of said N clock gater circuits; and
   N latches wherein each of said N latches is connected to a corresponding one of said N clock gater circuits; and wherein
   each said latch has a clock input, a set input, and an output, wherein said output of each of N−1 latches is connected to said gate input of each of a corresponding N−1 synchronizer circuit;
   the output of an $N^{th}$ latch is connected to the gate input of an $N^{th}$ clock gater circuit;
   each of said N latches shares a common input clock with each other and with an $N^{th}$ clock gater circuit, wherein N is an integer greater than 2.

2. The glitch free multi-clock control circuit of claim 1, wherein each of said N clock gater circuits further comprises
   a clock gater latch having an inverting clock input, a gate input, and an output;
   a delay cell having an input and an output; and
   an AND gate having a first and a second input and an output;
      wherein said gate input of said clock gater latch is connected to said output of said corresponding synchronizer circuit;
      said inverting clock input is connected to said input of said delay cell and to said clock input;
      said output of said delay cell is connected to a first input of said AND gate; and
      said output of said clock gater latch is connected to a second input of said AND gate.

3. The glitch free multi-clock control circuit of claim 1, wherein each of said N−1 synchronizer circuits further comprises
   a first and a second D flip flop each having a control input, a clock input and an output; wherein
      said clock inputs to all of said D flip flops are common;
      said first D flip flop's control input is connected to the output of said corresponding latch; and
      said second D flip flop's control input is connected to the output of said first D flip flop that immediately proceeds it.

4. The glitch free multi-clock control circuit of claim 1 wherein N is equal to 3.

* * * * *